(12) United States Patent
Choi

(10) Patent No.: US 7,335,585 B2
(45) Date of Patent: Feb. 26, 2008

(54) METHOD FOR PREVENTING THE FORMATION OF A VOID IN A BOTTOM ANTI-REFLECTIVE COATING FILLING A VIA HOLE

(75) Inventor: Yong Jun Choi, Seongnam-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 34 days.

(21) Appl. No.: 10/969,550

(22) Filed: Oct. 20, 2004

(65) Prior Publication Data

US 2005/0142855 A1 Jun. 30, 2005

(30) Foreign Application Priority Data

Dec. 30, 2003 (KR) ............... 10-2003-0100491

(51) Int. Cl.
*H01L 21/4763* (2006.01)

(52) U.S. Cl. ............... 438/636; 257/E21.262; 257/E21.273; 257/E21.029; 257/E23.167; 430/270.1; 430/907

(58) Field of Classification Search ............ 430/270.1, 430/907; 257/E21.262, E21.273, E21.029, 257/E23.167; 438/636
See application file for complete search history.

(56) References Cited

U.S. PATENT DOCUMENTS

| 6,042,999 A * | 3/2000 | Lin et al. ............... 430/316 |
| 6,180,316 B1 * | 1/2001 | Kajita et al. ............ 430/270.1 |
| 6,248,500 B1 * | 6/2001 | Mizutani et al. ......... 430/271.1 |
| 6,365,322 B1 * | 4/2002 | Padmanaban et al. .... 430/270.1 |
| 6,444,320 B1 * | 9/2002 | Takei et al. ............. 428/413 |
| 6,720,256 B1 | 4/2004 | Wu et al. |
| 2002/0102483 A1 * | 8/2002 | Adams et al. ............. 430/30 |
| 2002/0132123 A1 * | 9/2002 | Takei et al. ............. 428/413 |
| 2003/0146416 A1 * | 8/2003 | Takei et al. ............. 252/500 |
| 2003/0211417 A1 * | 11/2003 | Fryd et al. ............. 430/270.1 |
| 2004/0013971 A1 * | 1/2004 | Berger et al. ........... 430/270.1 |
| 2004/0137241 A1 * | 7/2004 | Lin et al. ............... 428/447 |
| 2004/0253535 A1 * | 12/2004 | Cameron et al. ........ 430/270.1 |
| 2005/0008964 A1 * | 1/2005 | Takei et al. ............. 430/270.1 |
| 2005/0074695 A1 * | 4/2005 | Nakamura et al. ....... 430/271.1 |
| 2005/0171277 A1 * | 8/2005 | Li et al. ................. 524/588 |
| 2005/0175927 A1 * | 8/2005 | Kishioka et al. ........ 430/270.1 |
| 2006/0041078 A1 * | 2/2006 | Takei et al. ............. 525/329.7 |

* cited by examiner

*Primary Examiner*—Michelle Estrada
*Assistant Examiner*—Jarrett J Stark
(74) *Attorney, Agent, or Firm*—Andrew D. Fortney

(57) ABSTRACT

A method for manufacturing a semiconductor device which, on performing a via first Dual Damascene process, inhibits or prevents the formation of a void in a bottom anti-reflective coating filling a via hole. The method typically includes the steps of forming a bottom anti-reflective coating (BARC) in a via hole in an interlayer dielectric on a semiconductor substrate sufficiently to fill the via hole; disposing an acid diffusion material on the BARC; forming a cross-link layer between the BARC and the acid diffusion material; removing the remaining acid diffusion material; and etching the cross-link layer, the BARC and the interlayer dielectric to form a trench extending from an upper portion of the via hole.

25 Claims, 11 Drawing Sheets

METHOD FOR PREVENTING THE FORMATION OF A VOID IN A BOTTOM ANTI-REFLECTIVE COATING FILLING A VIA HOLE

BACKGROUND OF THE INVENTION

1. Field of the Invention

The present invention relates to a method for manufacturing a semiconductor device, and more particularly to a semiconductor device and method for manufacturing a semiconductor device which, on performing a "via first" Dual Damascene process, inhibits or prevents the formation of a void in a bottom anti-reflective coating filling a via hole.

2. Description of the Background

Generally, with the high integration of semiconductor devices, an interconnect becomes narrowed. The narrowing of the interconnect generally causes an increase of resistance in the interconnect and furthermore a delay of signal transfer. To solve the problem of signal transfer delay, a multi-layered interconnect structure has been introduced, generally replacing the previous single layered interconnect structure.

However, in the multi-layered interconnect structure, an interval (or spacing) between adjacent interconnect lines is further narrowed so that parasitic capacitance between interconnects on the same layer increases and signal transfer delay of the semiconductor device further increases. Particularly, in case of an interconnect with relatively fine line width, signal transfer delay due to parasitic capacitance between interconnects has a marked effect on operational properties of semiconductor devices. To reduce parasitic capacitance between interconnects, it is preferable to reduce the thickness of interconnect and to thicken an interlayer dielectric. Accordingly, many proposals have been provided, wherein the interconnect is formed of low specific resistance material (for example, copper), and the interlayer dielectric includes one or more low permittivity materials. However, in case of copper, since vapor pressure of certain etching by-products is low, it is generally difficult to dry etch copper.

To solve this problem, a Damascene process has been recently proposed. In one Damascene process, a via hole or contact hole is formed in the interlayer dielectric, copper is deposited to fill the via hole or contact hole, and then excess copper is removed by means of planarization, thus forming a copper interconnect.

Meanwhile, Dual Damascene processes are generally classified into at least three types: a "via first" method, a "trench first" method, and a "self-aligned" method. In the via first method, an interlayer dielectric is etched to form a via hole, and the interlayer dielectric is then etched to form a trench over the via hole. On the contrary, in the trench first method, a trench is first formed, and a via hole is then formed under the trench. In the self-aligned method, a via hole hard mask (typically formed using an etch stop layer) is aligned with a trench mask, and both the via hole and the trench are then formed with one etch step. Among the above methods, the via first method has been widely used.

A conventional "via first" Dual Damascene process is now explained with reference to FIGS. 1A to 1D. First, as shown in FIG. 1A, a first interlayer dielectric 102 with low permittivity (for example, a borophosphosilicate glass [BPSG] layer) is deposited on a semiconductor substrate 101 on which a device such as a transistor (not shown) has been formed. Then, an etch stop layer 103 (e.g., formed of silicon nitride) is deposited on the first interlayer dielectric 102, and a second interlayer dielectric 104 with low permittivity (for example, a $SiH_4$-based silicon oxide layer) is then deposited on the etch stop layer 103. Then, a photoresist is applied on the second dielectric 104, and the photoresist is then patterned to form a first photoresist pattern 105 exposing a portion of the second interlayer dielectric 104 corresponding to a via hole region.

In this state, as shown in FIG. 1B, using the first photoresist pattern 105 as an etching mask, the exposed second interlayer dielectric 104 is etched and removed to expose the etch stop layer 103. The etching process is continuously performed so that the exposed etch stop layer 103 and the first interlayer dielectric 102 are sequentially etched and removed to form a via hole 106.

Then, as shown in FIG. 1C, a BARC 107 (Bottom Anti-Reflective Coating) is coated to a desired thickness on the resultant structure, filling the via hole 106. Herein, a conventional BARC 107 is composed of an acrylate based polymer (having pendant anthracene based chromophore and hydroxide groups), a cross-linking agent, a surfactant, a thermal acid generator (TAG) and solvent (PGMEA, PGME, EL, NBA and so on), etc. Then, a photoresist is applied on the resultant structure including BARC 107, and the photoresist is patterned to form a second photoresist pattern 108 exposing a portion of BARC 107 corresponding to a trench region.

Then, as shown in FIG. 1D, using the second photoresist pattern 108 as an etching mask, the exposed BARC 107 and second interlayer dielectric 104 are etched and removed to form a trench 109. Then, as shown in FIG. 1E, the second photoresist pattern 108 and the remaining BARC 107 are removed. Thereafter, a metal layer (not shown) fills the via hole 106 and the trench 109. The metal layer is then planarized by chemical mechanical polishing, thus completing the conventional via first Dual Damascene process.

Also, an alternative conventional via-first Dual Damascene process known as the Photoresist recess (PR recess) method may be used. According to the PR recess Dual Damascene method, a via hole is formed in interlayer dielectrics on a substrate, and the via hole is then sufficiently filled with a novolac resin. Thereafter, the novolac resin is recessed by an ashing process using an $O_2$ plasma. Then, a back side wet etch is performed on the resultant structure. Therefore, only a portion of via hole is filled with the novolac resin. Then, a conventional BARC comprising an acrylate based resin is coated on the resultant structure, sufficiently filling the remaining portion of the via hole, and a photoresist is applied on the BARC and patterned to form a photoresist pattern for a subsequent trench. And, using the photoresist pattern, the interlayer dielectrics are selectively etched to form the trench.

As described above, according to the conventional via first Dual Damascene process, the via hole is first formed, and then the BARC fills in the via hole in order to form the trench. However, with the high integration of semiconductor devices, an interconnect may be sufficiently narrowed so that the critical dimension (CD) of the via hole for the interconnect is also reduced. Thus, the BARC may fill the via hole sufficiently incompletely to produce a void (indicated as 107a in FIG. 1C).

Due to the void 107a formed in the BARC filling the via hole, in the subsequent trench formation process using the second photoresist pattern, a fence (indicated as 103a in FIG. 1D) may be formed, or a bottom face of the trench may not be uniformly etched, thereby deteriorating process reliability.

Also, according to the above-mentioned PR recess Dual Damascene method, since ashing of novolac resin and back side wet etching should be performed, the overall process is relatively complex and the process time becomes relatively long. Also, in the PR recess Dual Damascene method, additional etching equipment may be necessary.

SUMMARY OF THE INVENTION

Accordingly, the present invention has been made to solve the above-mentioned problems, and an object of the present invention is to provide a method for manufacturing a semiconductor device which, on performing a via first Dual Damascene process, inhibits or prevents the formation of a void in a bottom anti-reflective coating filling a via hole.

In order to achieve this object, there is provided a method for manufacturing a semiconductor device, comprising the steps of: (a) forming a bottom anti-reflective coating in a via hole in an interlayer dielectric on a semiconductor substrate sufficiently to fill the via hole; (b) disposing an acid diffusion material on the bottom anti-reflective coating; (c) forming a cross-link layer between the bottom anti-reflective coating and the acid diffusion material; (d) removing the remaining acid diffusion material on the cross-link layer; and (e) etching the cross-link layer, the bottom anti-reflective coating and the interlayer dielectric sufficiently to form a trench extending from an upper portion of the via hole.

According to the invention, the method may further comprise forming a photoresist pattern defining a trench formation region on the cross-link coating; and etching the cross-link layer, the bottom anti-reflective coating and the interlayer dielectric may further use the photoresist pattern as an etching mask to form the trench.

Preferably, the bottom anti-reflective coating comprises a cross-linkable resin (such as a novolac resin), a chromophore (such as a naphthalene or anthracene based chromophore), a cross-linking agent and an organic solvent. The bottom anti-reflective coating preferably has a composition of from 1 to about 60 wt % of cross-linkable resin, from 1 to about 30 wt % of chromophore, from 1 to about 30 wt % of cross-linking agent, from 1 to about 99 wt % of organic solvent, and from 0.001 to about 10 wt % of surfactant. Preferably, the organic solvent comprises a $C_1$-$C_4$ alkyl ether and/or $C_2$-$C_4$ ester of a $C_2$-$C_4$ alkylene glycol (such as propylene glycol methyl ether acetate (PGMEA), propylene glycol dimethyl ether, ethylene glycol methyl ether acetate, ethylene glycol dimethyl ether, ethylene glycol diacetate, propylene glycol monomethyl ether (PGME), ethylene glycol monomethyl ether, ethylene glycol monoethyl ether, etc.), N-bromoacetamide (NBA), ethyl lactate (EL), or a combination thereof.

Preferably, in the step of forming the cross-link layer, hydrogen species (e.g., $H^+$) included in the acid diffusion material are diffused toward the surface of the bottom anti-reflective coating, preferably through heat treatment, and hydroxide species (e.g., $OH^-$) or their equivalent (e.g., $RO^-$ and/or $R$—$COO^-$ groups, where R represents a resin chain) in the cross-linking agent and/or novolac resin (contained in the bottom anti-reflective coating) are activated (preferably through heat treatment), so that the hydrogen and hydroxide (or phenoxide or carboxylate) species react with (e.g., neutralize) each other, thereby forming a chemically resistant cross-link layer between the acid diffusion material and the bottom anti-reflective coating.

Preferably, the bottom anti-reflective coating and the acid diffusion material independently have a thickness of from 10 to 500 nm.

Preferably, the bottom anti-reflective coating is heated at a temperature of 40 to 200° C. for 50 to 100 seconds, and the bottom anti-reflective coating and the acid diffusion material are reacted at a temperature of from 100 to 300° C. for 50 to 100 seconds.

Preferably, the acid diffusion material comprises a hydrophilic polymer, a solvent and an acid. Preferably, the acid comprises from 1 to about 60 wt % of hydrophilic polymer, from 1 to about 20 wt % of acid, from 1 to about 99 wt % of solvent and from 0.001 to about 10 wt % of surfactant. The hydrophilic polymer may comprise a conventional homo- or copolymer of acrylic acid, methacrylic acid, a $C_2$-$C_4$ hydroxyalkyl ester of (meth)acrylic acid (e.g., poly(-hydroxyethyl)methacrylate), salts thereof, etc. Preferably, the acid comprises hydrochloric acid, hydrobromic acid, hydrofluoric acid, sulfuric acid, nitric acid, phosphoric acid, acetic acid, acetic acid substituted with from 1 to 3 halogen atoms (e.g., chloroacetic acid, trifluoroacetic acid, etc.), tosylic acid, benzenesulfonic acid (which may have a substituent such as fluorine, bromine, nitro, etc.), mesylic acid, trifluoromethylsulfonic acid, or a mixture of at least two of the same.

According to a preferred embodiment of the invention, the interlayer dielectric comprises a first interlayer dielectric, a second interlayer dielectric and an etch stop layer, preferably between the first interlayer dielectric and the second interlayer dielectric.

According to the present invention, the bottom anti-reflective coating (preferably comprising a novolac resin based mixture with a low glass transition temperature) is heated through a first heat treatment step to have excellent via filling ability and to reduce or prevent the formation of voids in the bottom anti-reflective coating. Therefore, the preferred BARC composition improves a planarization degree of the bottom anti-reflective coating. Also, the cross-link layer having an excellent chemical resistance is formed on the bottom anti-reflective coating by use of the acid diffusion material through a second heat treatment step so as to minimize a chemical reaction of the bottom anti-reflective coating with the photoresist in a subsequent photolithography process, thus improving a process reliability. Also, according to the present invention, the overall process time can be reduced and the investment for etching equipment can be minimized or curtailed, compared to conventional PR recess Dual Damascene processes.

The invention further provides a semiconductor device intermediate, comprising a semiconductor substrate; an interlayer dielectric on the substrate, the interlayer dielectric having at least one via hole therein exposing a portion of the substrate; a bottom anti-reflective coating filling the via hole; and on the bottom anti-reflective coating, either (i) an acid diffusion material or (ii) a cross-link layer. In a preferred embodiment, the interlayer dielectric comprises a first interlayer dielectric, an etch stop layer and a second interlayer dielectric; and/or the semiconductor device intermediate includes the cross-link layer on the bottom anti-reflective coating. In the latter case, the semiconductor device intermediate may further comprise the acid diffusion material on the cross-link layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. FIGS. 2A to 2F are cross-sectional views showing a method for manufacturing a semiconductor device according to a preferred embodiment of the present invention.

Figure 1A:
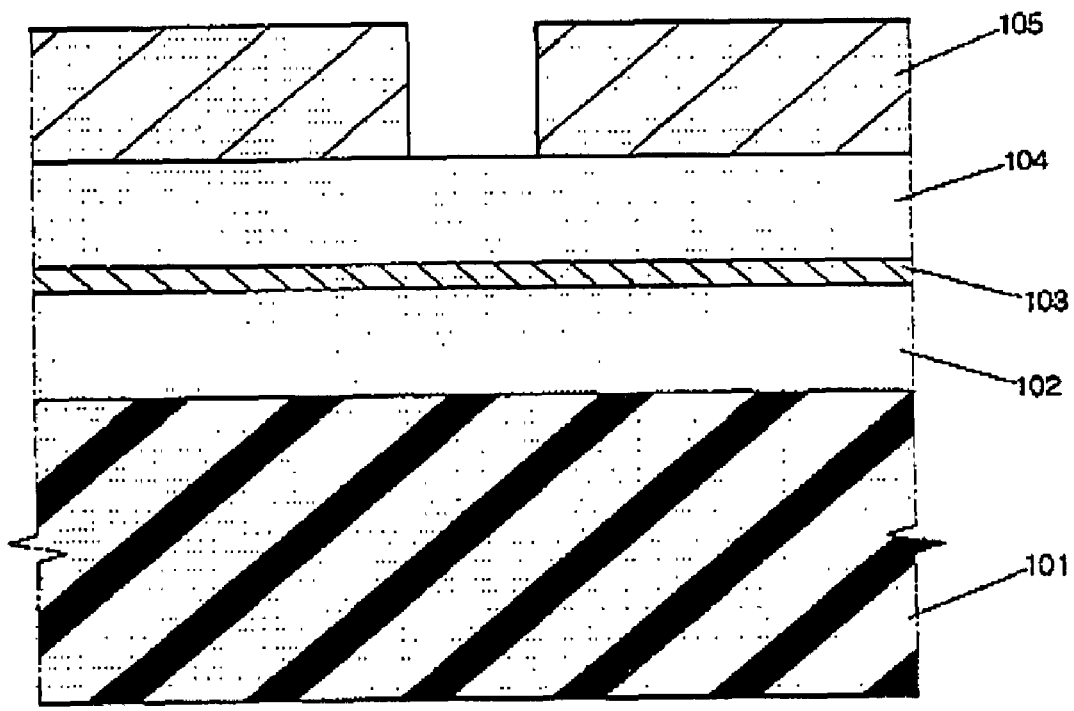
FIGS. 1A to 1E are cross-sectional views showing a conventional method for manufacturing a semiconductor device.
Figure 1B:
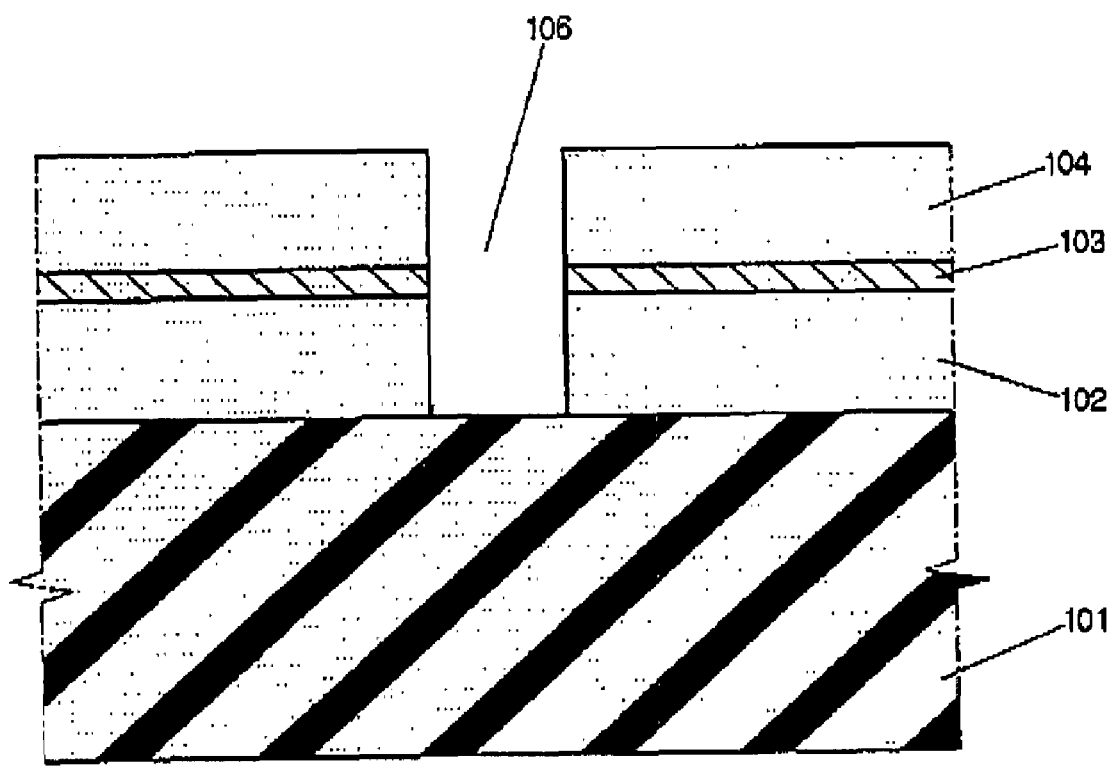
Figure 1C:
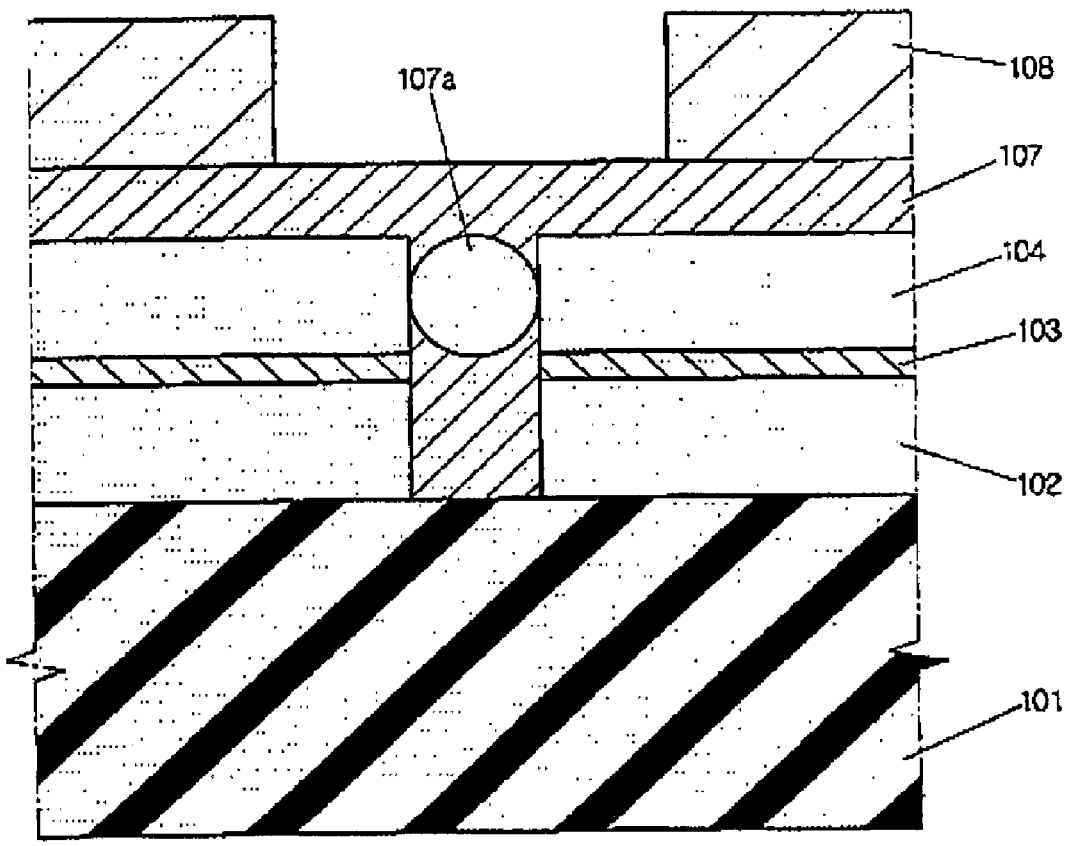
Figure 1D:
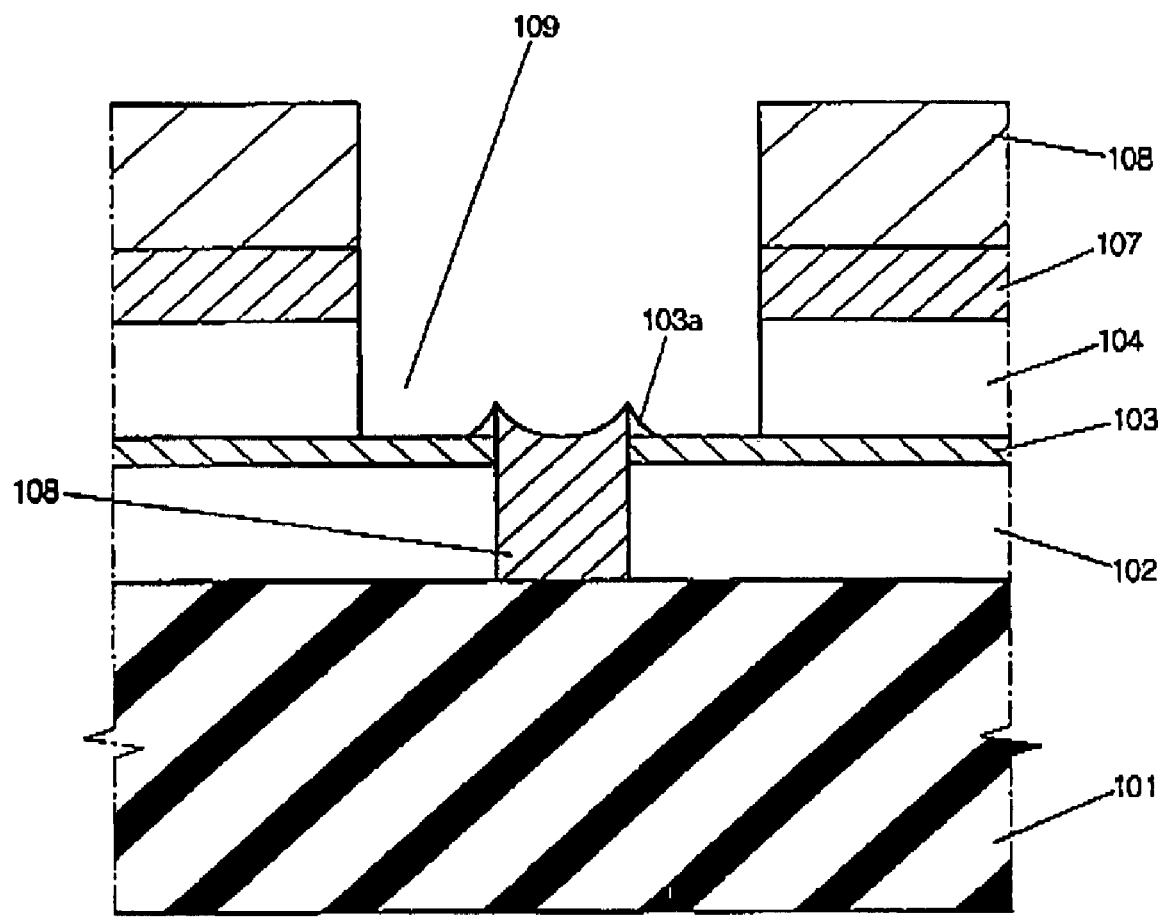
Figure 1E:
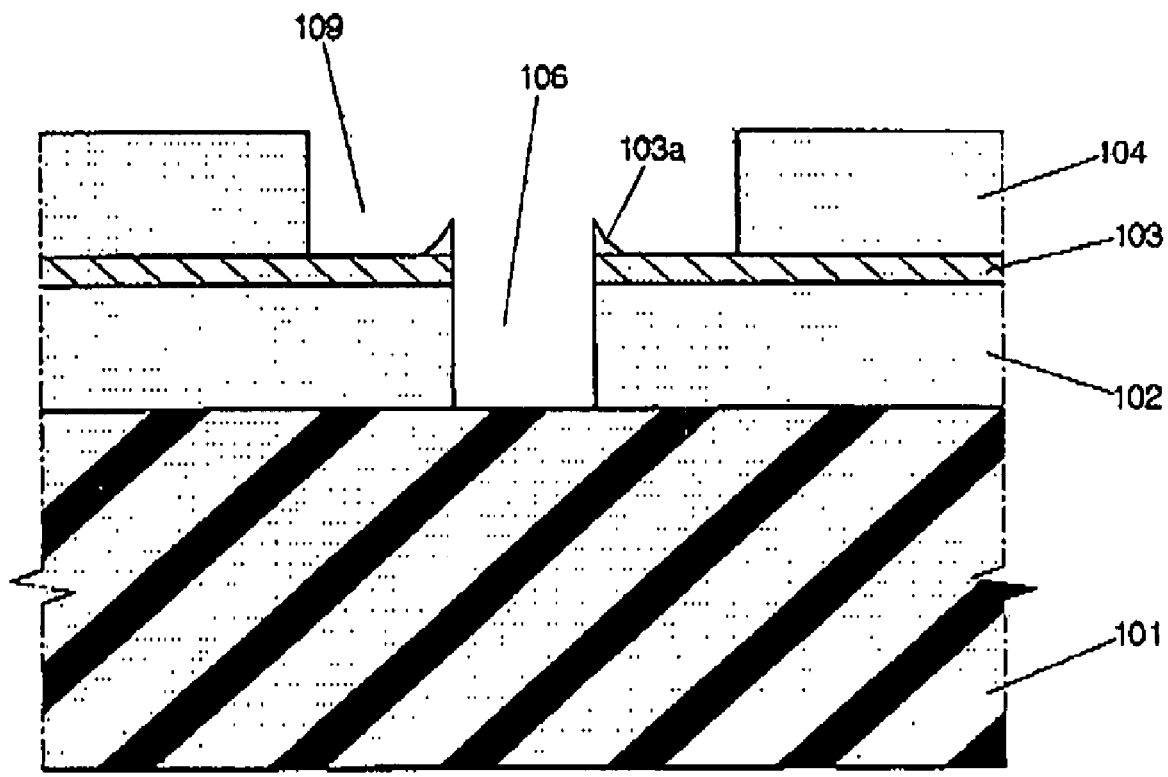
Figure 2A:
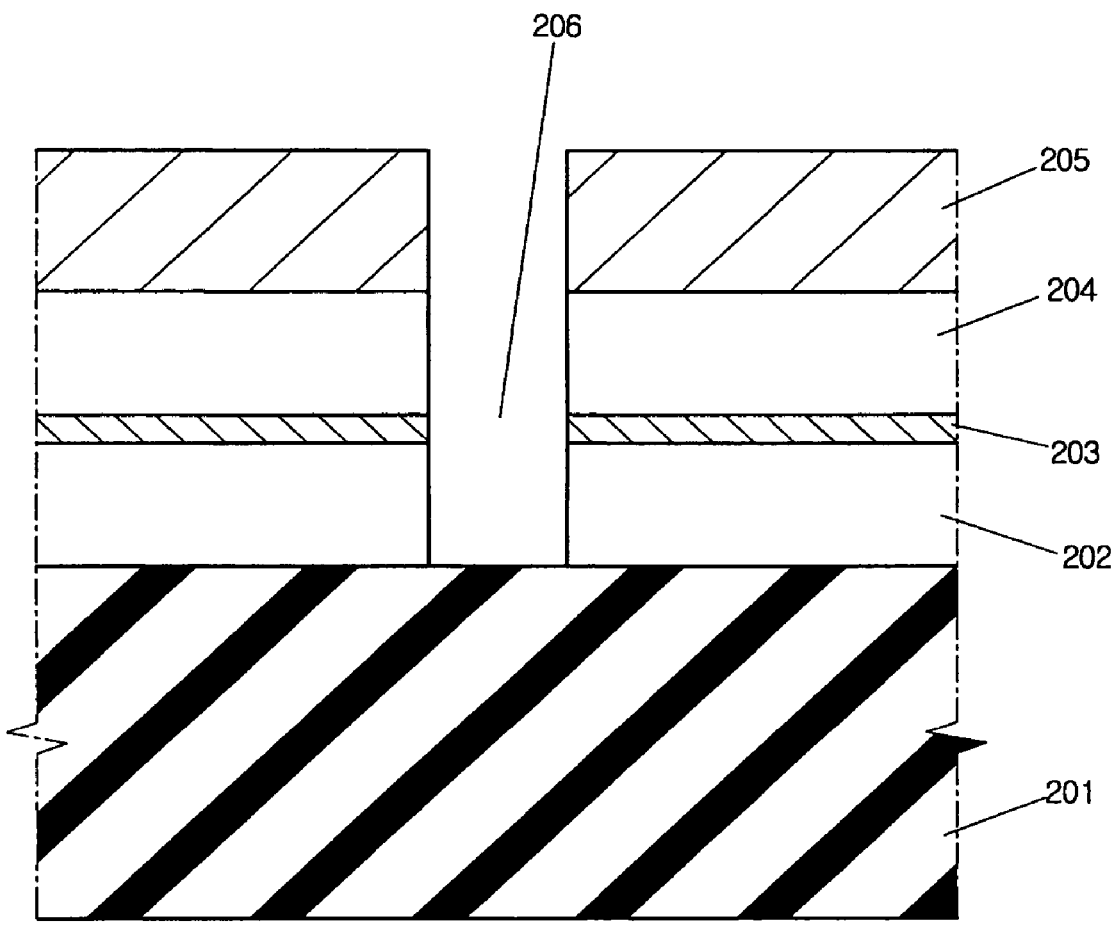
FIGS. 2A to 2F are cross-sectional views showing a method for manufacturing a semiconductor device according to a preferred embodiment of the present invention.

First, as shown in FIG. 2A, a first interlayer dielectric 202 with low permittivity is deposited on a semiconductor substrate 201. Herein, although not shown in the drawing, it is evident that on the semiconductor substrate, an isolation layer defining an active region of the substrate 201, a capacitor and/or a transistor on the active region, etc. may be previously formed.

The first interlayer dielectric 202 can be formed of various materials. In particular, a tetraethyl orthosilicate (TEOS)-based oxide layer (such as Low Pressure-TEOS, $O_3$-TEOS, d-TEOS and so on), undoped silicate glass (USG), fluorosilicate glass (FSG), $SiH_4$-based glass layer (e.g., deposited by High Density Plasma CVD) or BPSG layer may be used. Such dielectrics and methods for their formation on a semiconductor substrate are well known.

Then, an etch stop layer 203 comprising a material having a significantly lower etch rate than that of an overlying dielectric material under conditions for etching the overlying dielectric material is deposited on the first interlayer dielectric 202, and a second interlayer dielectric 204 with low permittivity is then deposited on the etch stop layer 203. The second interlayer dielectric 204, which may be the same as or different from the first interlayer dielectric 202, may be formed from any one of the materials used to form the first interlayer dielectric 202. However, e.g., etch stop layer 203 may be silicon nitride when second interlayer dielectric 204 is a different material, such as USG, FSG, TEOS, BPSG, etc. Similarly, etch stop layer 203 may be USG or FSG when second interlayer dielectric 204 is a different material, such as silicon nitride, BPSG, etc.

Then, a photoresist is applied on the second dielectric 204 and the photoresist is then patterned to form a first photoresist pattern 205 exposing a portion of the second interlayer dielectric 204 corresponding to a via hole region.

In this state, using the first photoresist pattern 205 as an etching mask, the exposed second interlayer dielectric 204 is etched and removed to expose the etch stop layer 203. The etching process is continuously performed so that the exposed etch stop layer 203 and the first interlayer dielectric 202 are sequentially etched and removed to form a via hole 206 exposing the substrate 201. The same or different etch chemistries and/or conditions may be used for etching the various interlayer dielectric materials 202-204. In a preferred embodiment, the via hole is etched using the same non-selective etch chemistry to etch each of the second interlayer dielectric 204, the etch stop layer 203 and the first interlayer dielectric 202.

Meanwhile, although the stacked structure of the first interlayer dielectric 202, the etch stop layer 203 and the second interlayer dielectric 204 is provided in order to form the via hole in this embodiment of the present invention, other various embodiments can be adapted.

Figure 2B:
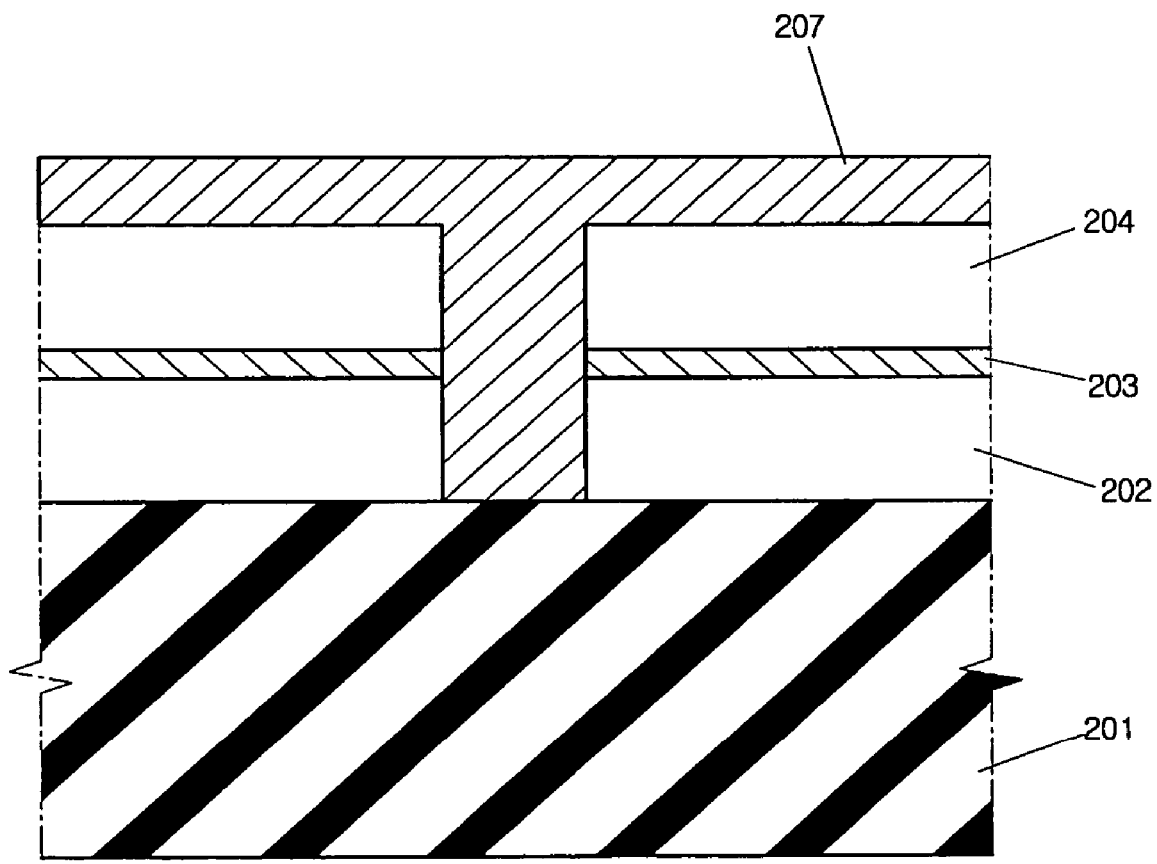

After the via hole 206 has been formed, as shown in FIG. 2B, and after the first photoresist pattern 205 is removed, a bottom anti-reflective coating 207 is deposited on the second interlayer dielectric 204 and in the via hole 206 so as to sufficiently fill the via hole 206. Bottom anti-reflective coating 207 generally has a thickness of from 10 to 500 nm. Herein, the bottom anti-reflective coating 207 generally comprises an organic polymer or resin (such as a novolac or bisphenol-type resin) having a low glass transition temperature, a chromophore (such as a naphthalene or anthracene based chromophore; i.e., one comprising a naphthalene or anthracene moiety) having high absorbance of light used in a subsequent photolithography step (e.g., anthracene, which absorbs light at 248 nm), a cross-linking agent (such as a conventional diene-, triene-, or azo based cross-linking agent, a conventional photoacid generator or, preferably, a chemical acid-initiated cross-linking agent such as N,N,N, N-tetrakis(methoxymethyl)-ethylene diamine biscarbamate) and an organic solvent.

Preferably, the bottom anti-reflective coating 207 has a composition of from 1 to about 60 wt % of resin (more preferably from 10 to about 35 wt %), from 1 to about 30 wt % of chromophore (more preferably from 3 to about 15 wt %), from 1 to about 30 wt % of cross-linking agent (more preferably from 3 to about 20 wt %) and from 1 to about 99 wt % of organic solvent (more preferably from 40 to about 80 wt %). Meanwhile, 0.001~10 wt % of surfactant can be added to the bottom anti-reflective coating. The organic solvent may be selected from the group consisting of those described in paragraph [0017] above (e.g., in preferred embodiments, propylene glycol methyl ether acetate (PGMEA), propylene glycol monomethyl ether (PGME), N-bromoacetamide (NBA) and EL, or a combination thereof).

After the bottom anti-reflective coating 207 has been deposited, a first heat treatment is performed thereto at a temperature of 40 to 200° C. for 50 to 100 seconds so as to flow the bottom anti-reflective coating 207, thereby reducing, inhibiting or preventing the formation of voids in the bottom anti-reflective coating 207. By using a low glass transition resin such as a novolac resin based mixture as the bottom anti-reflective coating 207 and performing the first heat treatment, the filling ability (i.e., the ability to fill the via hole 206) of the bottom anti-reflective coating 207 becomes excellent. The excellence of the filling ability of the bottom anti-reflective coating 207 is due at least in part to the low glass transition temperature of the resin. Therefore, the formation of a void in the via hole 206 may be prevented and a planarization degree of the bottom anti-reflective coating 207 may be improved. Meanwhile, in the first heat treatment process, it is preferable to minimize the reaction of the cross-linking agent and any hydroxide (e.g., $OH^-$), phenoxide (e.g., $R-O^-$) or carboxylate (e.g., $R-COO^-$) species in the resin.

Figure 2C:
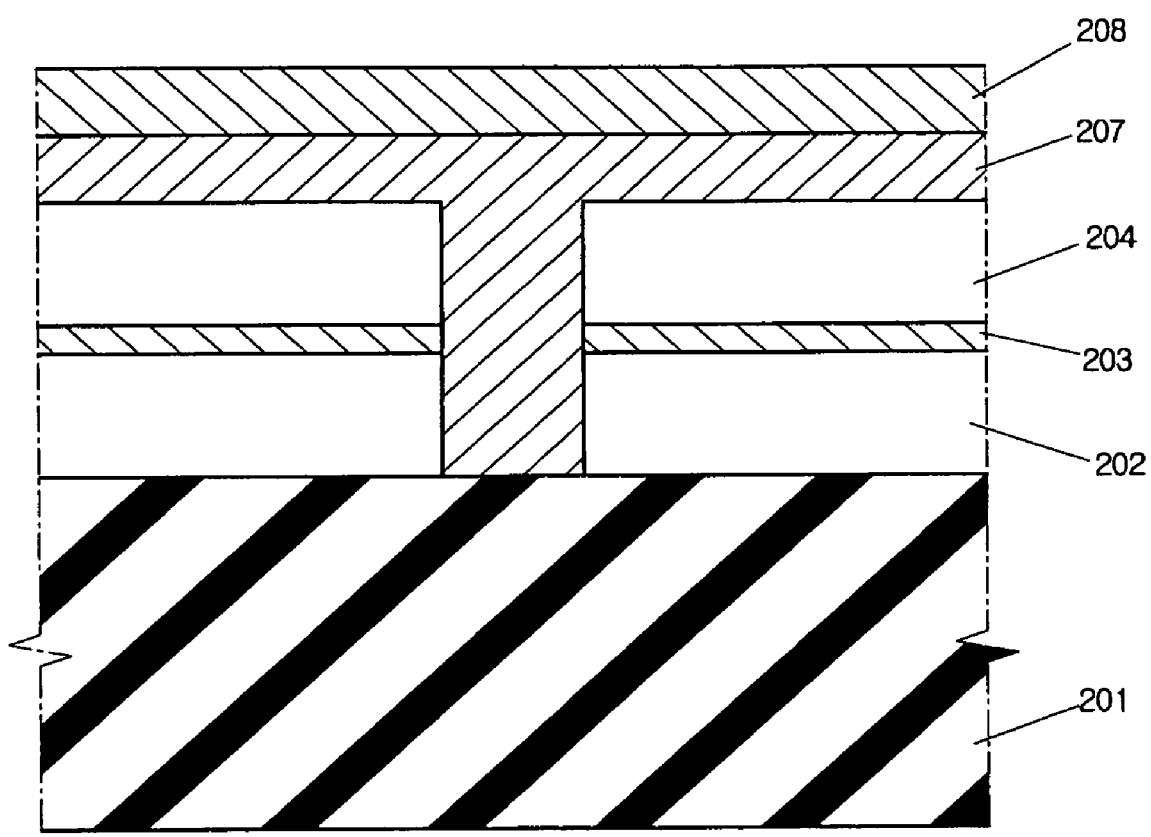

Then, as shown in FIG. 2C, an acid diffusion material 208 is deposited (preferably with a thickness of 10~500 nm) on the bottom anti-reflective coating 207. The acid diffusion material 208 preferably comprises a hydrophilic polymer, a solvent (e.g., water) and an acid such as hydrochloric acid, sulfuric acid, acetic acid, tosylic acid, etc. Preferably, the acid diffusion material 208 comprises from 1 to about 60 wt % of hydrophilic polymer (preferably from 10 to 35 wt %), from 1 to about 20 wt % of acid (preferably from 3 to 10 wt %) and from 1 to about 99 wt % (preferably from 50 to 90 wt %) of solvent (e.g., water or other polar solvent such as methanol, ethanol, etc., but preferably deionized water). Herein, 0.001~10 wt % of surfactant can be added to the acid diffusion material 208. The acid may be any of those described in paragraph [0021] above (e.g., one or more of hydrochloric acid, sulfuric acid, acetic acid and/or tosylic acid). Meanwhile, since the acid diffusion material 208 comprises a water-soluble material (unlike the bottom anti-reflective coating 207), it is hardly mixed with the bottom anti-reflective coating 207.

Figure 2D:
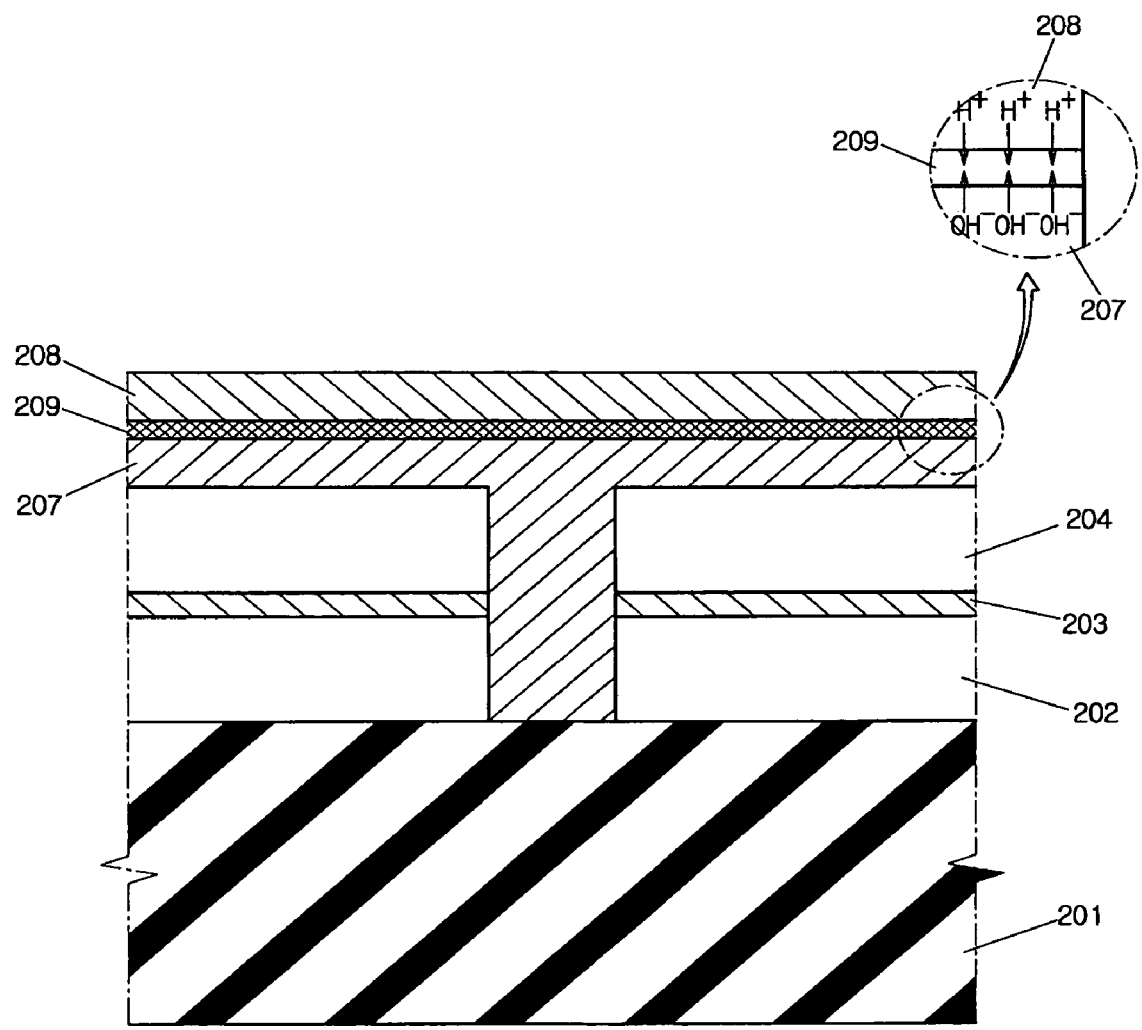

After the acid diffusion material 208 has been deposited on the bottom anti-reflective coating 207, as shown in FIG. 2D, a second heat treatment (e.g., of the substrate and/or the acid diffusion material 208 and bottom anti-reflective coating 207, etc.) is performed at a temperature of 100 to 300° C. for 50 to 100 seconds. Through the second heat treatment, hydrogen species (e.g., H$^+$) included in the acid diffusion material 208 are believed to diffuse toward the surface of the bottom anti-reflective coating 207. Also, through the second heat treatment, hydroxide, phenoxide or carboxylate species (e.g., OH$^-$, R—O$^-$, or R—COOH$^-$) in cross-link agent and/or novolac resin (contained in the bottom anti-reflective coating 207) are believed to be activated. Thus, the hydrogen and hydroxide, phenoxide or carboxylate species are reacted with (e.g., neutralize) each other to thereby form a cross-link layer 209 between the acid diffusion material 208 and the bottom anti-reflective coating 207. The cross-link layer 209 may be thought of as an acid-neutralized upper layer or portion of BARC 207.

The purpose for which the cross-link layer 209 is formed is to improve a chemical resistance of BARC 207 to subsequently deposited photoresist. In other words, the cross-link layer 209 serves to prevent a chemical reaction between such a photoresist with the bottom anti-reflective coating 207 in the subsequent photolithography process for forming a trench.

Figure 2E:
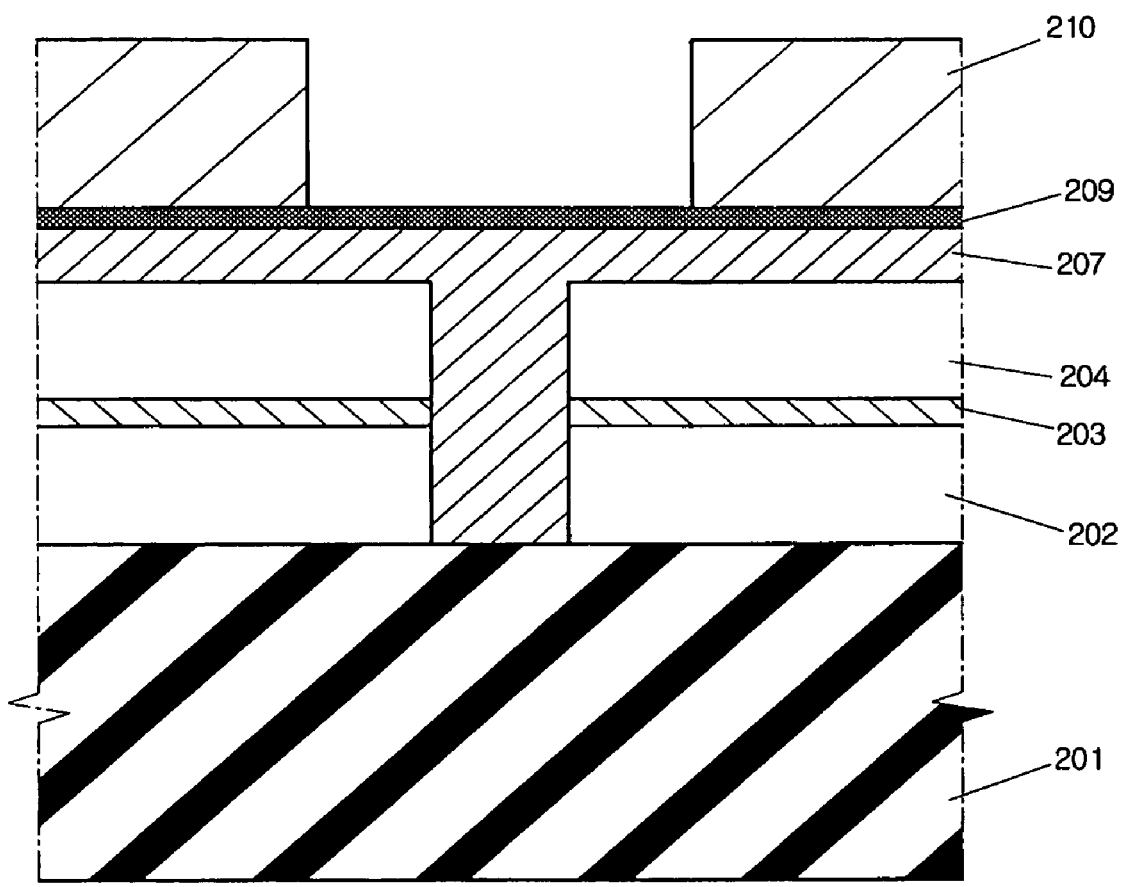

Thereafter, as shown in FIG. 2E, the acid diffusion material 208 is removed by rinsing and/or immersing in deionized water to expose the cross-link layer 209. Then, a photoresist is applied on the cross-link layer 209 and is patterned using a photolithography process to form a second photoresist pattern 210 exposing a portion of the cross-link layer 209 corresponding to a trench region. Herein, as described above, since the cross-link layer 209 on the bottom anti-reflective coating 207 has an excellent chemical resistance to the photoresist in second photoresist pattern 210, the photoresist generally does not react with the bottom anti-reflective coating 207 to any adverse extent.

Figure 2F:
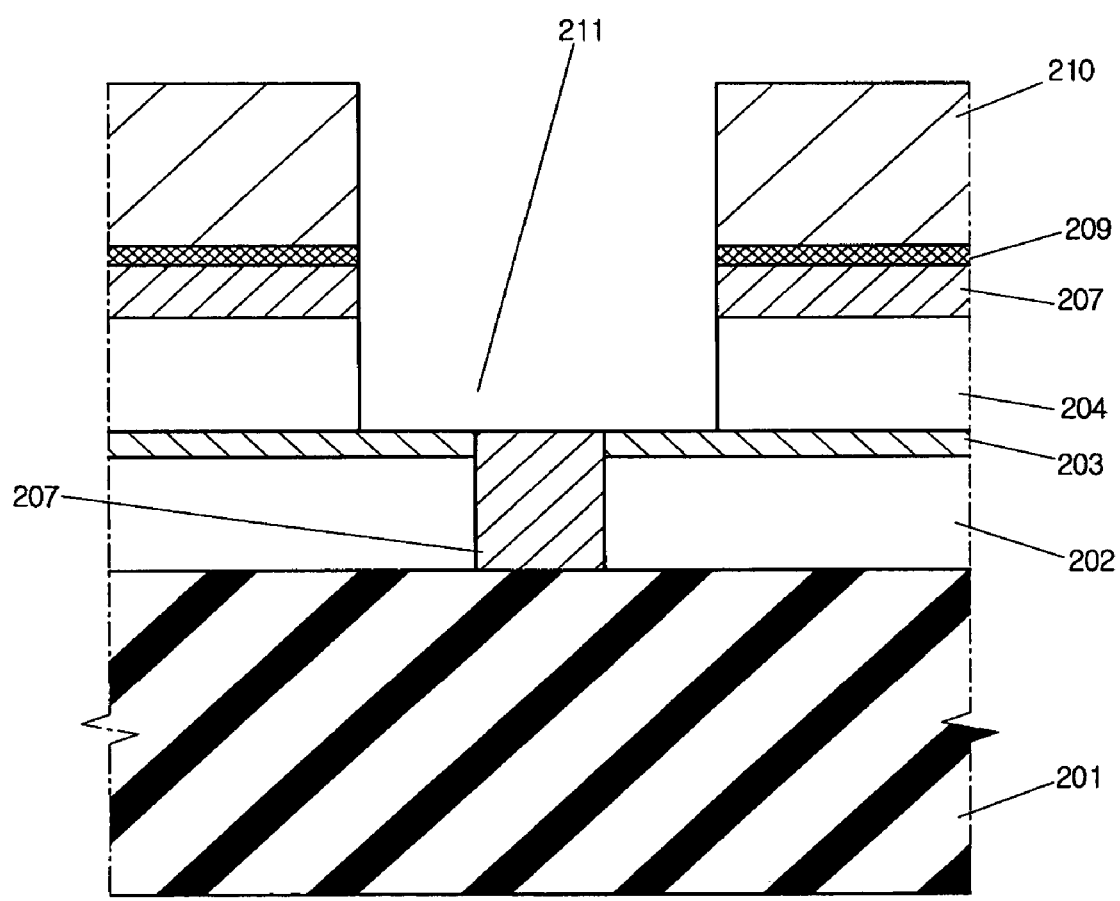

Then, as shown in FIG. 2F, using the second photoresist pattern 210 as an etching mask, the exposed cross-link layer 209, the bottom anti-reflective coating 207 and the second interlayer dielectric 204 are etched and removed to form a trench 211.

Meanwhile, although not shown in the drawing, after the second photoresist pattern 210 and the remaining cross-link layer 209 and the bottom anti-reflective coating 207 are removed, a metal layer (not shown) fills the via hole 207 and the trench. The metal layer is then planarized by chemical mechanical polishing, thus completing the manufacturing processes of the semiconductor device according to the present invention.

The manufacturing method of the semiconductor device according to the present invention has the following effects.

The bottom anti-reflective coating mixture comprising a resin (e.g., a novolac resin) having a low glass transition temperature may be heated to reduce, inhibit or prevent the formation of voids in the bottom anti-reflective coating, improve the via filling ability of the bottom anti-reflective coating, and/or improve a planarization degree of the bottom anti-reflective coating.

Also, the cross-link layer having an excellent chemical resistance to reaction with subsequently deposited photoresist is formed on the upper surface or portion of the bottom anti-reflective coating by use of an acid diffusion material and (optionally) a second heat treatment so as to minimize a chemical reaction between the bottom anti-reflective coating and the photoresist in the subsequent photolithography process, thus improving a process reliability.

Also, according to the present invention, the overall process time can be reduced and the investment for etching equipment can be reduced, minimized or curtailed, compared to conventional PR recess Dual Damascene processes.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:
   forming a bottom anti-reflective coating in a via hole in an interlayer dielectric sufficiently to fill the via hole, said via hole exposing the semiconductor substrate and heating said bottom anti-reflective coating sufficiently to prevent a formation of voids in the bottom anti-reflective coating, wherein the bottom antireflective coating comprises a cross-linkable resin, a chromophore, a cross-linking agent and an organic solvent;
   heating said bottom anti-reflective coating sufficiently to prevent a formation of voids in the bottom anti-reflective coating;
   disposing an acid diffusion material on the heated bottom anti-reflective coating, wherein the acid diffusion material comprises from 1 to about 60 wt % of a hydrophilic polymer, from 1 to about 20 wt % of an acid, and from 1 to about 99 wt % of said solvent;
   after the step of heating said bottom anti-reflective coating, and separately from the step of heating said bottom anti-reflective coating, heating the heated bottom anti-reflective coating and said acid diffusion material to form a cross-link layer between the heated bottom anti-reflective coating and said acid diffusion material;
   removing the acid diffusion material that remains on the cross-link layer; and
   etching the cross-link layer, the bottom anti-reflective coating and the interlayer dielectric sufficiently to form a trench extending from an upper portion of the via hole.

2. The method of claim 1, further comprising forming a photoresist pattern on the cross-link layer to define a trench formation region thereon, and wherein the step of etching the cross-link layer, the bottom anti-reflective coating and the interlayer dielectric further comprises using the photoresist pattern as an etching mask to form said trench.

3. The method of claim 1, wherein the bottom antireflective coating further contains a surfactant.

4. The method of claim 1, wherein the bottom antireflective coating has a composition comprising from 1 to about 60 wt % of said cross-linkable resin, from 1 to about 30 wt % of said chromophore, from 1 to about 30 wt % of said cross-linking agent and from 1 to about 99 wt % of said organic solvent.

5. The method of claim 3, wherein the bottom antireflective coating comprises said surfactant in an amount of from 0.001 to about 10 wt %.

6. The method of claim 1, wherein the organic solvent comprises propylene glycol methyl ether acetate (PGMEA), propylene glycol monomethyl ether (PGME), N-bromoacetamide (NBA), EL, or a combination thereof.

7. The method of claim 1, wherein said bottom antireflective coating and said acid diffusion material are heated sufficiently to react at least one species in an upper part of said bottom anti-reflective coating with an active species in said acid diffusion material.

8. The method of claim 7, wherein heating said bottom anti-reflective coating and said acid diffusion material causes hydrogen species in the acid diffusion material to diffuse toward the surface of the bottom anti-reflective coating and hydroxide or equivalent species in the bottom anti-reflective coating to be activated, so that the hydrogen and the hydroxide or equivalent species neutralize each other, thereby forming the cross-link layer.

9. The method of claim 7, wherein heating said bottom anti-reflective coating and said acid diffusion material causes said acid in the acid diffusion material to react with said crosslinking agent in the bottom anti-reflective coating, thereby forming the cross-link layer.

10. The method of claim 1, wherein said cross-linkable resin comprises a novolac resin.

11. The method of claim 1, wherein said chromophore comprises a naphthalene or anthracene based chromophore.

12. The method of claim 1, wherein the bottom antireflective coating and the acid diffusion material are deposited respectively with a thickness of 10 to 500 nm.

13. The method of claim 1, wherein the step of heating said bottom anti-reflective coating causes said bottom anti-reflective coating to flow.

14. The method of claim 13, wherein the bottom anti-reflective coating is heated at a temperature of 40 to 200° C. for 50 to 100 seconds.

15. The method of claim 7, wherein the bottom anti-reflective coating and the acid diffusion material are heated at a temperature of 100 to 300° C. for 50 to 100 seconds.

16. The method of claim 1, wherein the acid diffusion material further contains a surfactant.

17. The method of claim 16, wherein the surfactant in the acid diffusion material is present in an amount of from 0.001 to about 10 wt %.

18. The method of claim 1, wherein the acid comprises hydrochloric acid, hydrobromic acid, hydrofluoric acid, sulfuric acid, nitric acid, phosphoric acid, acetic acid, acetic acid substituted with from 1 to 3 halogen atoms, tosylic acid, benzenesulfonic acid, mesylic acid, trifluoromethylsulfonic acid, or a mixture thereof.

19. The method of claim 1, further comprising the steps of forming said interlayer dielectric on said semiconductor substrate; and forming said via hole in the interlayer dielectric to expose a portion of the substrate.

20. A method for manufacturing a semiconductor device, the method comprising the steps of:
providing a substrate;
sequentially forming a first interlayer dielectric, an etch stop layer and a second interlayer dielectric on the substrate;
selectively etching the second interlayer dielectric, the etch stop layer and the first interlayer dielectric to form a via hole exposing a portion of the substrate;
forming a bottom anti-reflective coating in the via hole and on the second interlayer dielectric sufficiently to fill the via hole, wherein the bottom anti-reflective coating comprises a cross-linkable resin, a chromophore, a cross-linking agent, and an organic solvent;
heating the bottom anti-reflective coating sufficiently to prevent a formation of voids in the bottom and-reflective coating;
forming an acid diffusion material on the heated bottom anti-reflective coating, wherein the acid diffusion material comprises from 1 to about 60 wt % of a hydrophilic polymer, from 1 to about 20 wt % of an acid, and from 1 to about 99 wt % of a solvent;
after the step of heating said bottom anti-reflective coating, and separately from the step of heating said bottom anti-reflective coating, heating the acid diffusion material and the heated bottom anti-reflective coating to form a cross-link layer between the heated bottom anti-reflective coating and the acid diffusion material;
removing the acid diffusion material that remains on the cross-link layer; and
etching the cross-link layer, the bottom anti-reflective layer and the second interlayer dielectric to form a trench connected to the via hole.

21. The method of claim 20, wherein the bottom antireflective coating has a composition comprising from 1 to about 60 wt % of said cross-linkable resin, from 1 to about 30 wt % of said chromophore, from 1 to about 30 wt % of said cross-linking agent and from 1 to about 99 wt % of said organic solvent.

22. The method of claim 20, wherein said heating the acid diffusion material and the bottom anti-reflective coating causes hydrogen species in the acid diffusion material to diffuse toward the surface of the bottom anti-reflective coating and hydroxide or equivalent species in the bottom anti-reflective coating to be activated, so that the hydrogen and the hydroxide or equivalent species neutralize each other, thereby forming the cross-link layer.

23. The method of claim 20, wherein said heating the acid diffusion material and the bottom and-reflective coating causes the acid in the acid diffusion material to react with said crosslinking agent in the bottom anti-reflective coating, thereby forming the cross-link layer.

24. The method of claim 20, wherein said cross-linkable resin comprises a novolac resin.

25. The method of claim 20, wherein the acid comprises hydrochloric acid, hydrobromic acid, hydrofluoric acid, sulfuric acid, nitric acid, phosphoric acid, acetic acid, acetic acid substituted with from 1 to 3 halogen atoms, tosylic acid, benzenesulfonic acid, mesylic acid, trifluoromethylsulfonic acid, or a mixture thereof.

* * * * *